US009122820B2

(12) United States Patent
Chen et al.

(10) Patent No.: US 9,122,820 B2
(45) Date of Patent: Sep. 1, 2015

(54) SUBWAVELENGTH GRATING COUPLER

(71) Applicant: Board of Regents, The University of Texas System, Austin, TX (US)

(72) Inventors: Ray T. Chen, Austin, TX (US); Xiaochuan Xu, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 5 days.

(21) Appl. No.: 14/188,569

(22) Filed: Feb. 24, 2014

(65) Prior Publication Data
US 2014/0241661 A1    Aug. 28, 2014

Related U.S. Application Data

(60) Provisional application No. 61/770,694, filed on Feb. 28, 2013.

(51) Int. Cl.
| | |
|---|---|
| G02B 6/00 | (2006.01) |
| G06F 17/50 | (2006.01) |
| G02B 6/124 | (2006.01) |
| G02B 6/126 | (2006.01) |
| G02B 6/13 | (2006.01) |
| G02B 6/136 | (2006.01) |

(52) U.S. Cl.
CPC ............... G06F 17/50 (2013.01); G02B 6/124 (2013.01); G02B 6/126 (2013.01); G02B 6/13 (2013.01); G02B 6/136 (2013.01)

(58) Field of Classification Search
CPC ...... G02B 6/126; G02B 6/2746; G02B 6/105; G02B 6/124; G02B 6/02085; G02B 6/12007; G06F 17/5018; G06F 17/5036; G06F 17/5009

USPC .................... 385/11, 31–37; 359/352; 702/56
See application file for complete search history.

(56) References Cited

U.S. PATENT DOCUMENTS

| | | | | |
|---|---|---|---|---|
| 8,274,738 | B2 * | 9/2012 | Hasman et al. | ............... 359/573 |
| 2013/0058370 | A1 * | 3/2013 | Chang-Hasnain et al. | 372/50.11 |
| 2014/0285892 | A1 * | 9/2014 | Sauvage-Vincent et al. | . 359/572 |

OTHER PUBLICATIONS

M. Asghari and A. V. Krishnamoorthy, "Silicon Photonics Energy-Efficient Communication", Nature Photonics 5(5), 268 (2011).
M. Lipson, "Guiding, Modulating, and Emitting Light on Silicon-Challenges and Opportunities", J. Lightwave Technol. 23(12), 4222 (2005).
L. Liu, M. Pu, K. Yvind, and J. M. Hvam, "High-Efficiency, Large-Bandwidth Silicon-On-Insulator Grating Coupler Based on a Fully-Etched Photonic Crystal Structure", Appl. Phys. Lett. 96(5), 051126 (2010).
T. Shoji, T. Tsuchizawa, T. Watanabe, K. Yamada, and H. Morita, "Low Loss Mode Size Converter from 0.3 um Square Si Wire Waveguides to Singlemode Fibres", Electron. Lett. 38(25), 1669 (2002).

(Continued)

*Primary Examiner* — Ellen Kim
(74) *Attorney, Agent, or Firm* — Paul S. Drake

(57) ABSTRACT

A method, system or device for configuring an optical coupling device including obtaining characteristics of an optical signal and ambient conditions for storage in memory, utilizing a processor for identifying an optimum effective subwavelength area refractive index and a grating period for the input signal and ambient characteristics stored in memory, and utilizing the processor for identifying a preferred filling factor for a transverse polarization.

20 Claims, 8 Drawing Sheets

(56) References Cited

OTHER PUBLICATIONS

S. J. McNab, N. Moll, and Y. A. Vlasov, "Ultra-Low Loss Photonic Integrated Circuit with Membrane-Type Photonic Crystal Waveguides", Opt. Express 11(22), 2927 (2003).

M. Pu, L. Liu, H. Ou, K. Yvind, and J. M. Hvam, "Ultra-Low-Loss Inverted Taper Coupler for Silicon-On-Insulator Ridge Waveguide", Opt. Commun. 283(19), 3678 (2010).

V. R. Almeida, R. R. Panepucci, and M. Lipson, "Nanotaper for Compact Mode Conversion", Opt. Lett. 28(15), 1302 (2003).

P. Cheben, D. X. Xu, S. Janz, and A. Densmore, "Subwavelength Waveguide Grating for Mode Conversion and Light Coupling in Integrated Optics", Opt. Express 14(11), 4695 (2006).

P. Cheben, P. J. Bock, J. H. Schmid, J. Lapointe, S. Janz, D. X. Xu, A. Densmore, A. Delage, B. Lamontagne, and T. J. Hall, "Refractive Index Engineering with Subwavelength Gratings for Efficient Microphotonic Couplers and Planar Waveguide Multiplexers", Opt. Lett. 35(15), 2526 (2010).

D. Taillaert, F. Van Laere, M. Ayre, W. Bogaerts, D. Van Thourhout, P. Bienstman, and R. Baets, "Grating Couplers for Coupling between Optical Fibers and Nanophotonic Waveguides", Jpn. J. Appl. Phys., Part 1 45(8A), 7 (2006).

Y. Tang, Z. Wang, L. Wosinski, U. Westergren, and S. He, "Highly Efficient Nonuniform Grating Coupler for Silicon-On-Insulator Nanophotonic Circuits", Opt. Lett. 35(8), 1290 (2010).

G. Roelkens, D. Vermeulen, D. Van Thourhout, R. Baets, S. Brision, P. Lyan, P. Gautier, and J. M. Fedeli, "High Efficiency Diffractive Grating Couplers for interfacing a Single Mode Optical Fiber with a Nanophotonic Silicon-On-Insulator Waveguide Circuit", Appl. Phys. Lett. 92(13), 131101 (2008).

M. Antelius, K. B. Gylfason, and H. Sohlstrom, "An Apodized SOI Waveguide-To-Fiber Surface Grating Coupler for Single Lithography Silicon Photonics", Opt. Express 19(4), 3592 (2011).

F. Van Laere, G. Roelkens, M. Ayre, J. Schrauwen, D. Taillaert, D. Van Thourhout, T. F. Krauss, and R. Baets, "Compact and Highly Efficient Grating Couplers Between Optical Fiber and Nanophotonic Waveguides", J. Lightwave Technol. 25(1), 151 (2007).

R. Halir, P. Cheben, S. Janz, D. X. Xu, I. Molina-Fernandez, and J. G. Wanguemert-Perez, "Waveguide Grating Coupler with Subwavelength Microstructures", Opt. Lett. 34(9), 1408 (2009).

R. Halir, P. Cheben, J. H. Schmid, R. Ma, D. Bedard, S. Janz, D. X. Xu, A. Densmore, J. Lapointe, and I. Molina-Fernandez, "Continuously Apodized Fiber-To-Chip Surface Grating Coupler With Refractive Index Engineered Subwavelength Structure", Opt. Lett. 35(19), 3243 (2010).

C. Xia and H. K. Tsang, "Nanoholes Grating Couplers for Coupling Between Silicon-on-Insulator Waveguides and Optical Fibers", Photon. J. IEEE 1(3), 184 (2009).

X. Xu, H. Subbaraman, A. Hosseini, C. Y. Lin, D. Kwong, and R. T. Chen, "Stamp Printing of Silicon-Nanomembrane-Based Photonic Devices Onto Flexible Substrates With a Suspended Configuration", Opt. Lett. 37(6), 1020 (2012).

P. Yeh, A. Yariv, and C. S. Hong, "Electromagnetic Propagation in Periodic Stratified Media. I. General Theory", J. Opt. Soc. Am. 67(4), 423 (1977).

P. Bienstman and R. Baets, "Optical Modelling of Photonic Crystals and VCSELs Using Eigenmode Expansion and Perfectly Matched Layers", Opt. Quantum Electron. 33(4), 327 (2001).

D. Taillaert, P. Bienstman, and R. Baets, "Compact Efficient Broadband Grating Coupler for Silicon-On-Insulator Waveguides", Opt. Lett. 29(23), 2749 (2004).

S. M. Rytov, "Electromagnetic Properties of Stratified Material", Sov. Phys. JETP 2(3), 10 (1956).

X. Chen and H. K. Tsang, "Polarization-Independent Grating Couplers for Silicon-On-Insulator Nanophotonic Waveguides", Opt. Lett. 36(6), 796 (2011).

C. R. Doerr, C. Long, C. Young-Kai, and L. L. Buhl, "Wide Bandwidth Silicon Nitride Grating Coupler", IEEE Photon. Technol. Lett. 22(19), 1461 (2010).

\* cited by examiner

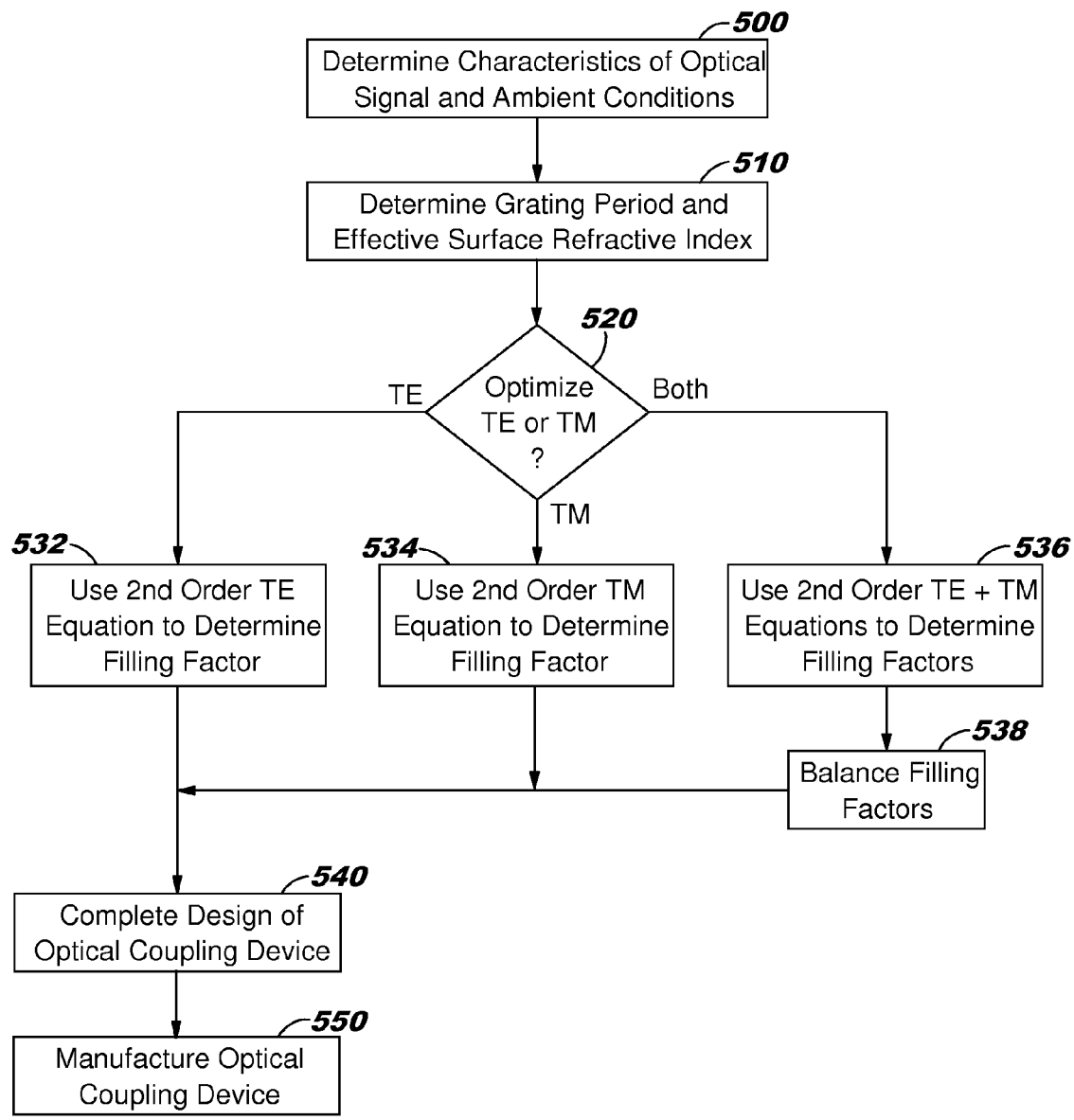

SUBWAVELENGTH GRATING COUPLER

This application claims priority to U.S. Provisional Application No. 61/770,694 entitled "Subwavelength Grating Coupler" filed Feb. 28, 2013.

This invention was made with government support under FA9550-08-1-0394 and FA9550-11-C-0014 awarded by the Air Force Office of Scientific Research. The government has certain rights in the invention.

BACKGROUND

1. Technical Field

The present invention relates generally to an optical grating coupler, and in particular, to a subwavelength grating coupler for silicon integrated photonics.

2. Description of Related Art

Guided wave optical devices and systems are being utilized in many applications in the telecommunications, cable television, instrumentation and computation industries. A variety of devices have been developed and utilized in implementing the use of guided waves for communicating information. These devices include the use of fiber optic cables for transmitting optical signals over longer distances and higher bandwidths than many other forms of communication. These devices also include planar optical waveguides in which optical signals are confined to narrow channels on a roughly two dimensional surface such as a silicon chip where the optical signals are routed, split, filtered, multiplexed and demultiplexed, switched, sensed, etc. as guided waves. By utilizing planar optical waveguides on silicon chips or other similar materials, a tremendous amount of existing technology is available for the manufacturing of these devices.

Various types of couplers are utilized for transitioning optical signals from a fiber optic cable to a silicon chip surface waveguide including prism couplers and grating couplers. There are many varieties of these couplers with varying characteristics such as efficiency, bandwidth, and manufacturability.

SUMMARY

The illustrative embodiments provide a method, system or device for configuring an optical coupling device including obtaining characteristics of an optical signal and ambient conditions for storage in memory, utilizing a processor for identifying an optimum effective subwavelength area refractive index and a grating period for the input signal and ambient characteristics stored in memory, and utilizing the processor for identifying a preferred filling factor for a transverse polarization.

BRIEF DESCRIPTION OF THE SEVERAL VIEWS OF THE DRAWINGS

The novel features believed characteristic of the invention are set forth in the appended claims. The invention itself, further objectives and advantages thereof, as well as a preferred mode of use, will best be understood by reference to the following detailed description of illustrative embodiments when read in conjunction with the accompanying drawings, wherein:

FIG. 5A is a flow diagram of a process for configuring an optical coupling device in which various embodiments may be implemented;

DETAILED DESCRIPTION

Processes and devices may be implemented and utilized to provide a subwavelength grating coupler between a fiber optic cable and an optical waveguide. These processes and apparatuses may be implemented and utilized as will be explained with reference to the various embodiments below.

Figure 1:
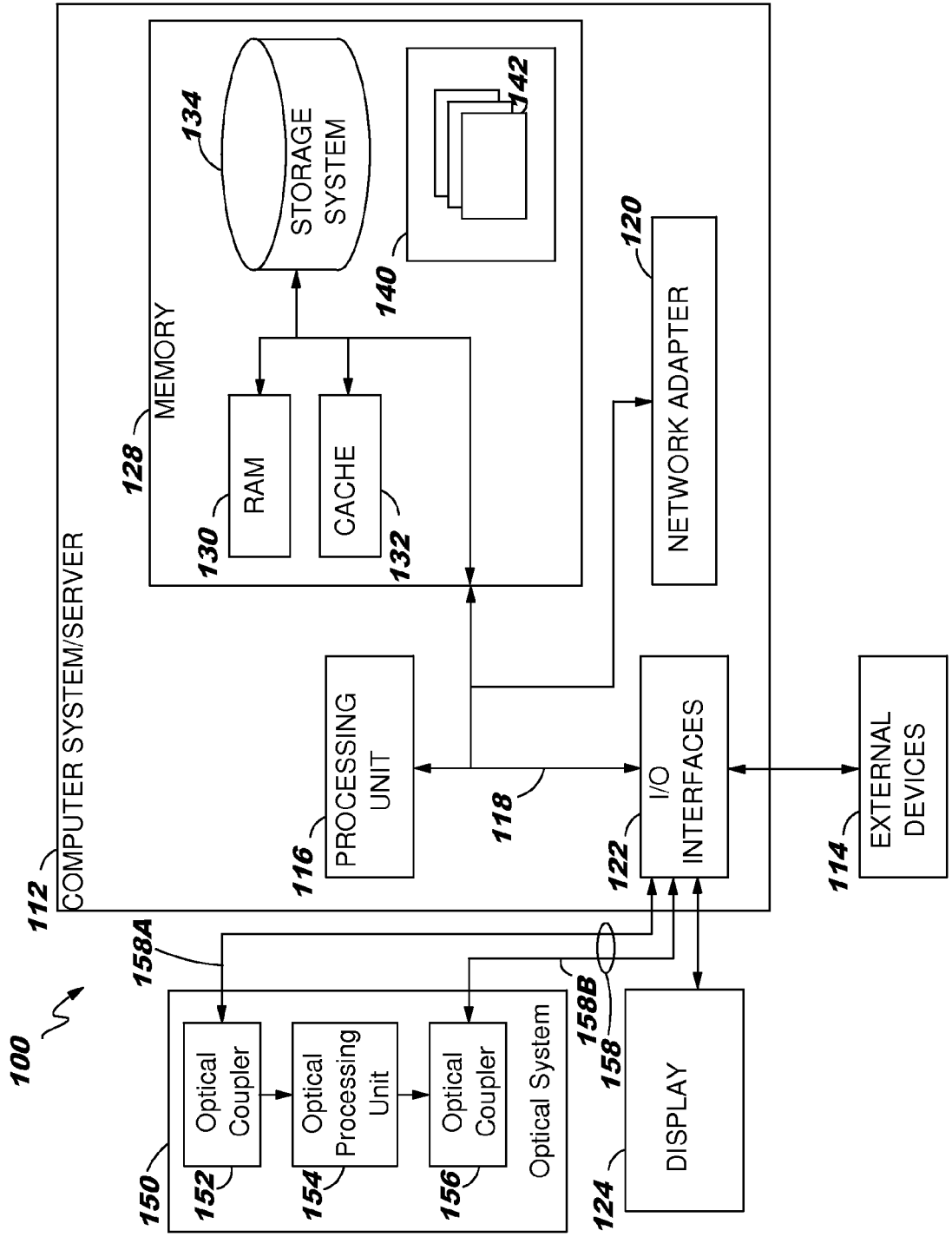
FIG. 1 is a block diagram of a data processing system in which various embodiments may be implemented.

FIG. 1 is a block diagram of a data processing system in which various embodiments may be implemented. Data processing system 100 is one example of a suitable data processing system and is not intended to suggest any limitation as to the scope of use or functionality of embodiments of the invention described herein. Regardless, data processing system 100 is capable of being implemented and/or performing any of the functionality set forth herein.

In data processing system 100 there is a computer system/server 112, which is operational with numerous other general purpose or special purpose computing system environments, peripherals, or configurations. Examples of well-known computing systems, environments, and/or configurations that may be suitable for use with computer system/server 112 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 112 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 112 may be practiced in distributed computing environments where tasks are performed by remote processing devices that are linked through a communications network. In a distributed computing environment, program modules may be located in both local and remote computer system storage media including memory storage devices.

As shown in FIG. 1, computer system/server 112 in data processing system 100 is shown in the form of a general-purpose computing device. The components of computer system/server 112 may include, but are not limited to, one or more processors or processing units 116, a system memory 128, and a bus 118 that couples various system components including system memory 128 to processor 116. These and other components may utilize optical communications with other components or even within a component. Such optical communications can include fiber optic cables and may utilize optical couplers between the fiber optical cables and the optical waveguides (e.g. planar or rectangular) on silicon chips or other planar substrates.

Bus 118 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 112 typically includes a variety of computer system readable media. Such media may be any available media that is accessible by computer system/server 112, and it includes both volatile and non-volatile media, removable and non-removable media.

System memory 128 can include computer system readable media in the form of volatile memory, such as random access memory (RAM) 130 and/or cache memory 132. Computer system/server 112 may further include other removable/non-removable, volatile/non-volatile computer system storage media. By way of example, storage system 134 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 118 by one or more data media interfaces. Memory 128 may include at least one program product having a set (e.g., at least one) of program modules that are configured to carry out the functions of embodiments of the invention. Memory 128 may also include data that will be processed by a program product.

Program/utility 140, having a set (at least one) of program modules 142, may be stored in memory 128 by way of example, and not limitation, as well as an operating system, one or more application programs, other program modules, and program data. Each of the operating system, one or more application programs, other program modules, and program data or some combination thereof, may include an implementation of a networking environment. Program modules 142 generally carry out the functions and/or methodologies of embodiments of the invention.

An optical system 150 may also communicate with a computer system or server through optical fibers 158 and I/O interface 122. I/O interface 122 or other device in communication with system 112 may provide an optical signal or beam (such as a laser beam) through optical fiber 158A to optical coupler 152 to optical processing unit 154. Optical processing unit 154 may then utilize the optical signal or beam to perform certain tasks such as biosensing, signal processing, etc., before returning the optical signal through optical coupler 156 back to I/O interface 122 through optical fiber 158B. Optical processing unit may include optical components, electronic components, chemical components, biological components etc. for processing the optical signal received through optical fiber 158A. For example, optical system 150 may be a testing device that utilizes optical signals or an optical beam for detection purposes. Optical system 150 may also be a communications network that utilizes DWDM (dense wavelength division multiplexing) for S, C and L bands. The return signal to system 112 may also be a non-optical signal such as an electronic signal. I/O interface 122 may also utilize optical waveguides in the process of communicating with optical system 150.

Computer system/server 112 may also communicate with one or more external devices 114 such as a keyboard, a pointing device, a display 124, etc.; one or more devices that enable a user to interact with computer system/server 112; and/or any devices (e.g., network card, modem, etc.) that enable computer system/server 112 to communicate with one or more other computing devices. Such communication can occur via I/O interfaces 122 through wired connections, optical connections, or wireless connections. Still yet, computer system/server 112 can communicate with one or more networks such as a local area network (LAN), a general wide area network (WAN), and/or a public network (e.g., the Internet) via network adapter 120. As depicted, network adapter 120 communicates with the other components of computer system/server 112 via bus 118. It should be understood that although not shown, other electrical and optical hardware and/or software components could be used in conjunction with computer system/server 112. Examples, include, but are not limited to: microcode, device drivers, tape drives, RAID systems, redundant processing units, data archival storage systems, external disk drive arrays, etc.

Figure 2:
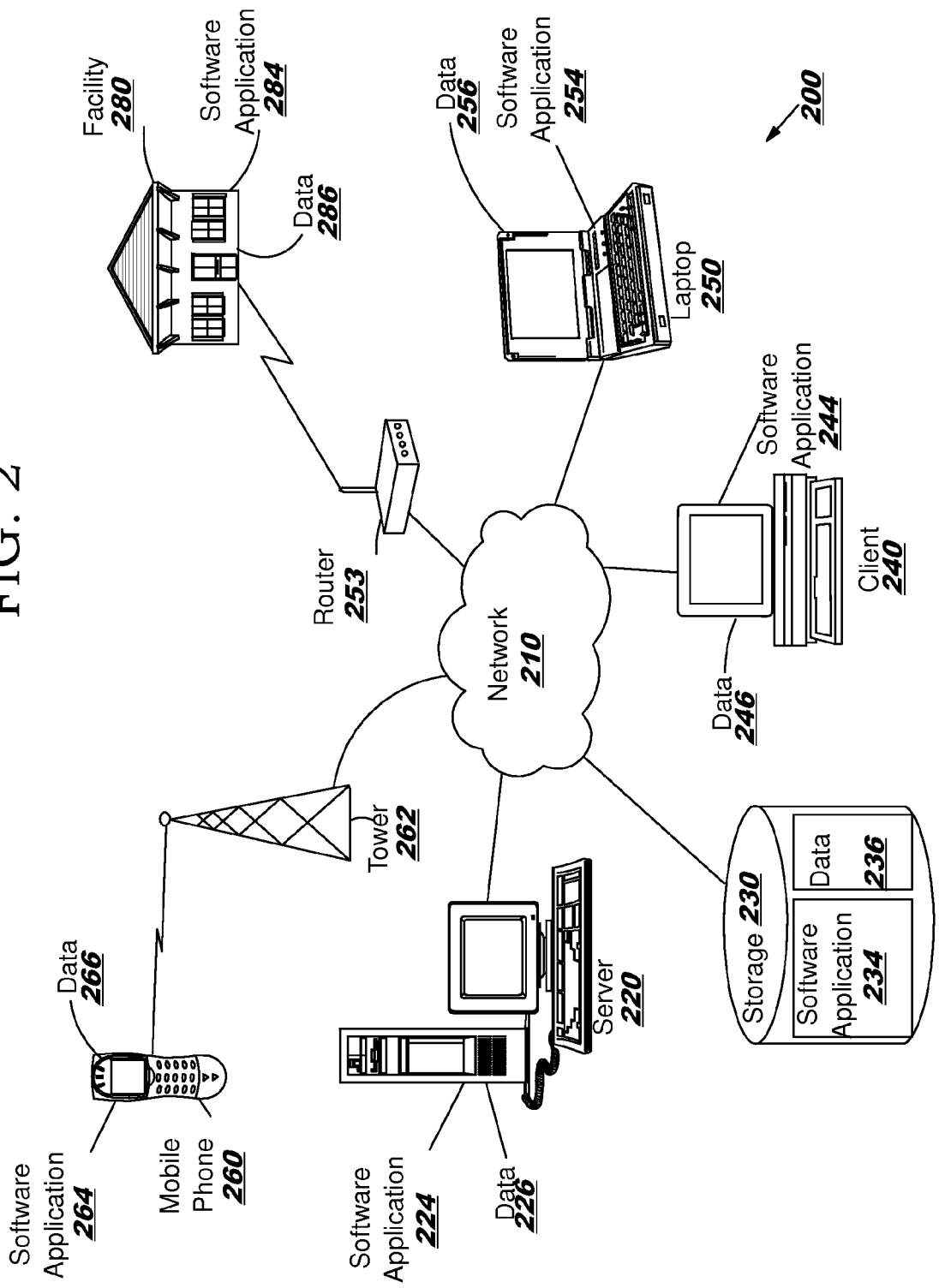
FIG. 2 is a block diagram of a network of data processing systems in which various embodiments may be implemented.

FIG. 2 is a block diagram of a network of data processing systems in which various embodiments may be implemented. Data processing environment 200 is a network of data processing systems such as described above with reference to FIG. 1. Software applications may execute on any computer or other type of data processing system in data processing environment 200. Data processing environment 200 includes network 210. Network 210 is the medium used to provide simplex, half duplex and/or full duplex communications links between various devices and computers connected together within data processing environment 200. Network 210 may include connections such as wire, wireless communication links, or fiber optic cables including the use of optical couplers.

Server 220 and client 240 are coupled to network 210 along with storage unit 230. In addition, laptop 250 and facility 280 (such as a home or business) are coupled to network 210 including wirelessly such as through a network router 253. A mobile phone 260 may be coupled to network 210 through a mobile phone tower 262. Data processing systems, such as server 220, client 240, laptop 250, mobile phone 260 and facility 280 contain data and have software applications including software tools executing thereon. Other types of data processing systems such as personal digital assistants (PDAs), smartphones, tablets and netbooks may be coupled to network 210.

Server 220 may include software application 224 and data 226 for software applications and data in accordance with embodiments described herein. Storage 230 may contain software application 234 and a content source such as data 236. Other software and content may be stored on storage 230 for sharing among various computer or other data processing devices. Client 240 may include software application 244 and data 246. Laptop 250 and mobile phone 260 may also include software applications 254 and 264 and data 256 and 266. Facility 280 may include software applications 284 and data 286. Other types of data processing systems coupled to network 210 may also include software applications. Software applications could include a web browser, email, or other software application.

Server 220, storage unit 230, client 240, laptop 250, mobile phone 260, and facility 280 and other data processing devices may couple to network 210 using wired connections, wireless communication protocols, or other suitable data connectivity. Client 240 may be, for example, a personal computer or a network computer.

In the depicted example, server 220 may provide data, such as boot files, operating system images, and applications to client 240 and laptop 250. Server 220 may be a single computer system or a set of multiple computer systems working together to provide services in a client server environment. Client 240 and laptop 250 may be clients to server 220 in this example. Client 240, laptop 250, mobile phone 260 and facility 280 or some combination thereof, may include their own data, boot files, operating system images, and applications. Data processing environment 200 may include additional servers, clients, and other devices that are not shown.

In the depicted example, data processing environment 200 may be the Internet. Network 210 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 200 also may be implemented as a number of different types of networks, such as for example, an intranet, a local area network (LAN), or a wide area network (WAN). Each of these networks may utilize optical fibers for transmitting or receiving information through optical couplers to various components of the data processing systems. FIG. 2 is intended as an example, and not as an architectural limitation for the different illustrative embodiments.

Among other uses, data processing environment 200 may be used for implementing a client server environment in which the embodiments may be implemented. A client server environment enables software applications and data to be distributed across a network such that an application functions by using the interactivity between a client data processing system and a server data processing system. Data processing environment 200 may also employ a service oriented architecture where interoperable software components distributed across a network may be packaged together as coherent business applications.

Figure 3A:
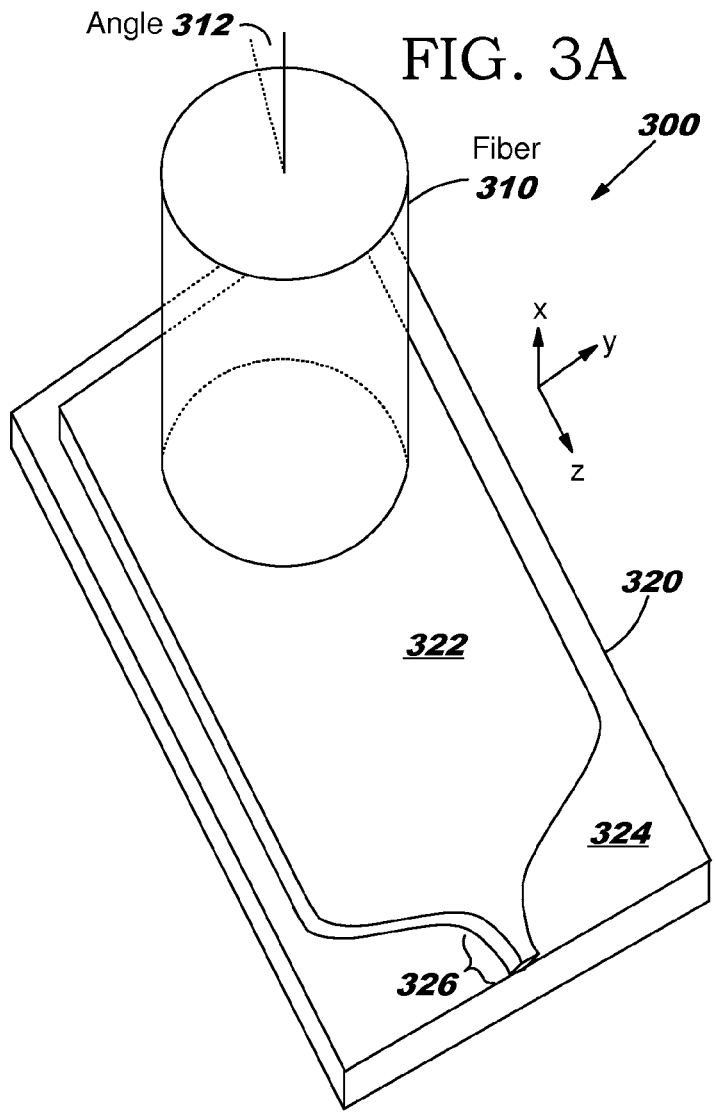
FIG. 3A is a perspective view of an optical coupling system in which various embodiments may be implemented.

FIG. 3A is a perspective view of an optical coupling system 300 in which various embodiments may be implemented. An optical fiber 310 is shown nearly orthogonal to and adjoining an optical coupling device 320. Optical coupling device 320 may be a discrete device or it may be planar with many other types of devices on a common substrate. Optical coupling device 320 includes an optical coupler 322 on top of substrate 324. Optical coupler 322 may be constructed of silicon or similar material. Substrate 324 may continue in the plane of the device and may contain many such devices. Substrate 324 may be an insulator such as silicon dioxide to provide electrical isolation from other devices. Also shown is an optical waveguide 326 for transmitting optical information to or from other devices planar to optical coupler 322. Optical coupler is bidirectional so the optical signal can travel in either direction. Not shown in this figure is a grating in optical coupler 322 and under fiber 310.

Optical fiber 310 is at a Θ angle 312 where the foot or butt of optical fiber is open towards (leaning away from) optical waveguide 326. Optical fiber may be help in place by a mechanical holder or other similar device. As a result, when an optical signal travels down the length of optical fiber 310, that signal strikes optical coupler 322 at Θ angle 312, and is then guided down waveguide 326 towards another coplanar optical device for handling. In addition, an optical signal may be guided up waveguide 326 from another coplanar optical device. That signal strikes optical coupler 322 and then travels up optical fiber 310 at Θ angle 312.

Also shown is the x, y and z axis directions of the optical fiber and optical coupler. The x direction is roughly in the direction of the optical fiber (the optical fiber is slightly angled from being orthogonal from the optical coupler) and is roughly the direction that light travels down the optical fiber to the optical coupler. The optical coupler is planar in the y and z directions, with the waveguide being in the z direction from the optical fiber. Θ angle 312 is in the z direction.

Figure 3B:
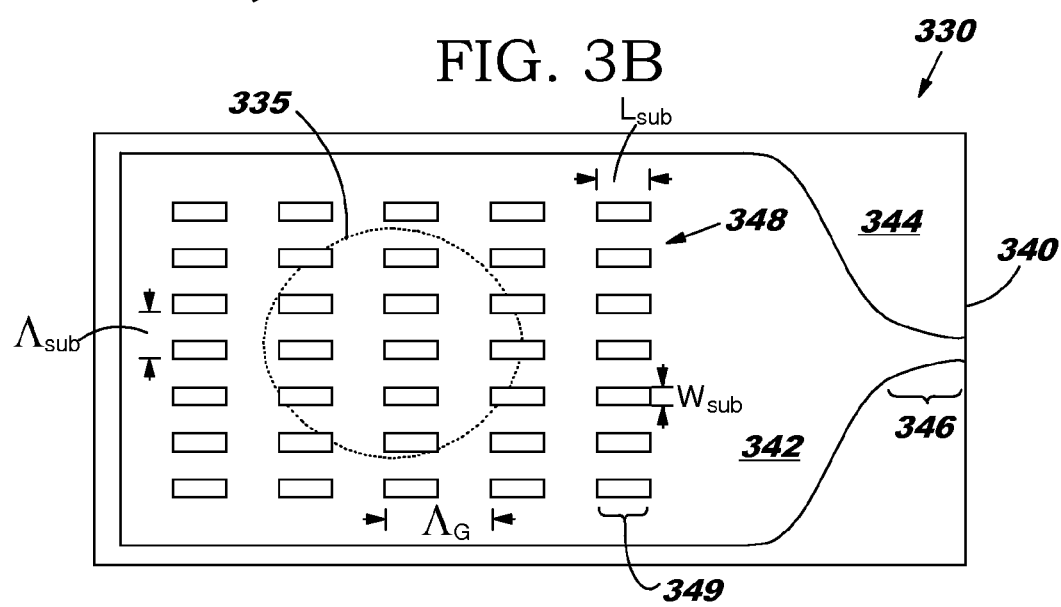
FIGS. 3B and 3C is an overhead view of the optical coupling system in which various embodiments may be implemented.

FIG. 3B is an overhead view of the optical coupling system 330 in which various embodiments may be implemented. An optical fiber 335 is shown in outline form nearly orthogonal to and adjoining an optical coupling device 340. Optical coupling device 340 may be a discrete device or it may be planar with many other types of devices on a common substrate. Optical coupling device 340 includes an optical coupler 342 on top of substrate 344. Optical coupler 342 may be constructed of silicon or similar material. Substrate 344 may continue in the plane of the device and may contain many such devices. Substrate 344 may be an insulator such as silicon dioxide to provide electrical isolation from other devices. An optical waveguide 346 is shown for transmitting optical information to or from other devices planar to optical coupler 342. Also shown in this figure is a grating 348 in optical coupler 342 and under fiber 335.

Grating 348 include a set of apertures in optical coupler 342 that transfer a high percentage of any optical signals from fiber 335 to waveguide 346. Grating 348 may be about 10 microns wide by 17.1 microns long, thereby matching the mode size of a typical single mode optical fiber. Although seven rows and seven columns of apertures are shown for illustrative purposes, many more such apertures may be utilized in an actual implementation. Each aperture reaches through optical coupler 342 to underlying substrate 344. Each subwavelength aperture has a width Wsub, a length Lsub, and a depth Dsub (not shown in this Figure). The layout of apertures is measured in periods from the beginning of one aperture to the beginning of the other aperture. A period may also be measured from the ending of one aperture to the ending of the other aperture. Other measures of dispersion may be utilized in alternative embodiments. The period in the same direction as the width of an aperture is Λsub also referred to as the subwavelength period. The period in the same direction as the length of an aperture is ΛG also called the grating period. In this embodiment, the period is about twice the length Lsub. These dimensions are utilized as described below in improving the efficiency and effectiveness of grating 348 in transmitting a light signal from optical fiber 335 to waveguide 346.

Figure 3C:
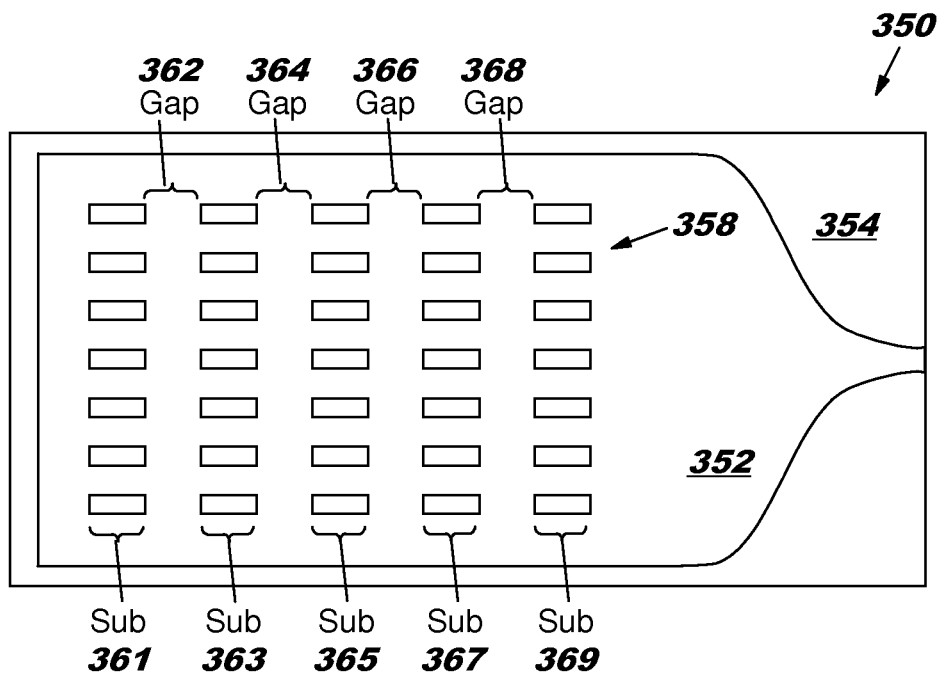

FIG. 3C is an overhead view of the optical coupling system 350 in which various embodiments may be implemented. Included is an optical coupler 352 with a grating region 358 on a substrate 354 as shown in FIG. 3B. In this example, grating region 358 has five subwavelength regions 361, 363, 365, 367 and 369 separated by four gap regions 362, 364, 366 and 368. In this embodiment, the length of each subwavelength region Sub (Lsub) is equal to the width of each Gap region (ΛG−Lsub).

Figure 3D:
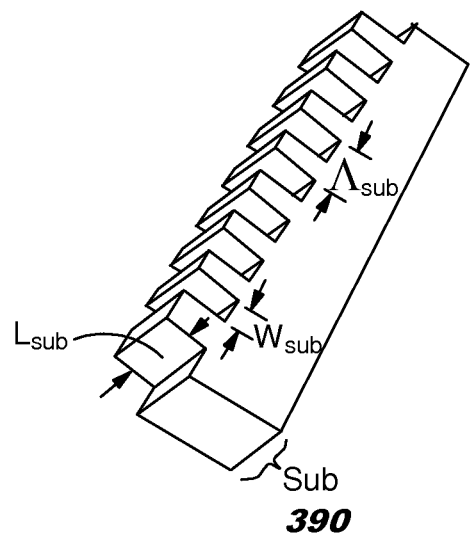
FIG. 3D is a perspective cutaway view of a subwavelength region of the grating area in which various embodiments may be implemented.

FIG. 3D is a perspective cutaway view of a subwavelength region 390 of the grating area 358 of FIG. 3C in which various embodiments may be implemented. Shown is a width Wsub and length Lsub of each subwavelength aperture. Also shown is a subwavelength period Λsub. These dimensions are utilized as described below.

Grating 348 and 358 is utilized to diffract the optical signal as desired. By utilizing subwavelength apertures, the incoming optical signal undergoes destructive interference to bend the light to the desired direction. In addition, the use of a subwavelength structure is utilized to adjust the effective refractive index of the grating to a desired index based on the surface layer, trench fill material (which may be air), and the underlying trench layer. According to effective medium theory, a composite medium including two or more different materials interleaved at the subwavelength scale can be approximated as a homogenous medium with an effective refractive index between the two or more materials. As a result, subwavelength period Λsub needs to be small compared to the wavelength of the optical signal inside the waveguide so that the grating area is a subwavelength region. In the example described below, Wsub is set to 80 nm, which is a commercially viable dimension given current semiconductor process technologies. As those technologies improve, smaller sizes may be utilized. In this example, crystalline polysilicon is the surface material, air is the trench fill material with a refractive index of 1, and buried silicon dioxide (BOX) is the underlying trench material with a refractive index of 1.45. By carefully selecting the dimensions and periodicity of the apertures, the effective refractive index can be set at a preferred level. The preferred refractive index is based primarily on the wavelength(s) of the optical signal being transmitted. As noted above, the dimensions and periodicity of the apertures can also be utilized to direct the incoming light signal into the waveguide.

The two refractive indices of particular concern are TE (transverse electric) and TM (transverse magnetic) polarizations. In the following equations and as shown in FIG. 3A, the x axis is in the direction of the optical fiber signal (roughly orthogonal to the surface of the optical coupler), the y axis is planar to the optical coupler device, perpendicular to the direction of the waveguide, and runs parallel to the widths of the apertures, and the z axis is in the direction of the waveguide, perpendicular to the x and y axes and parallel to the widths of the apertures. Light propagation is in the z direction and the electric field is in the y direction.

$$TE: \frac{\sqrt{n_{si}^2 - n_{TE}^2}}{n_{si}^2} \tan\left(\frac{\pi\sqrt{n_{si}^2 - n_{TE}^2}(\Lambda_{sub} - W_{sub})}{\lambda}\right) = \\ -\frac{\sqrt{n_{hole}^2 - n_{TE}^2}}{n_{hole}^2} \tan\left(\frac{\pi\sqrt{n_{hole}^2 - n_{TE}^2}\, W_{sub}}{\lambda}\right) \quad (1)$$

$$TM: \sqrt{n_{si}^2 - n_{TE}^2} \tan\left(\frac{\pi\sqrt{n_{si}^2 - n_{TM}^2}(\Lambda_{sub} - W_{sub})}{\lambda}\right) = \\ -\sqrt{n_{hole}^2 - n_{TM}^2} \tan\left(\frac{\pi\sqrt{n_{hole}^2 - n_{TM}^2}\, W_{sub}}{\lambda}\right) \quad (2)$$

$$0^{th} \text{ order } TE: \frac{1}{n_{TE}^{(0)}} = \left(\frac{f_{sub}}{n_{trench}^2} + \frac{(1 - f_{sub})}{n_{si}^2}\right)^{1/2} \quad (3)$$

$$0^{th} \text{ order } TM: n_{TM}^{(0)} = (f_{sub} n_{trench}^2 + (1 - f_{sub}) n_{si}^2)^{1/2} \quad (4)$$

$$2^{nd} \text{ order } TE: n_{TE}^{(2)} = \quad (5)$$
$$n_{TE}^{(0)}\left(1 + \frac{\pi^2}{3}\left(\frac{\Lambda_{sub}}{\lambda}\right)^2 f_{sub}^2 (1 - f_{sub})^2 (n_{trench}^2 - n_{si}^2)^2 (n_{TM}^{(0)})^2 \left(\frac{n_{TE}^{(0)}}{n_{trench} n_{si}}\right)^4\right)^{1/2}$$

$$2^{nd} \text{ order } TM: n_{TM}^{(2)} = \quad (6)$$
$$n_{TM}^{(0)}\left(1 + \frac{\pi^2}{3}\left(\frac{\Lambda_{sub}}{\lambda}\right)^2 f_{sub}^2 (1 - f_{sub})^2 \left(\frac{n_{trench}^2 - n_{si}^2}{n_{TM}^{(0)}}\right)^2\right)^{1/2}$$

As described below with reference to FIGS. 5A and 5B, these equations are utilized to determine the filling factor fsub which is utilized to determine subwavelength period Λsub (i.e. fsub=Wsub/Λsub) optimized for either TE or TM or a balance of both. As described above, trench width Wsub is set to 80 nm based on current process technologies. If much larger sizes are used for the trench width, then higher order equations may be needed for better approximations. The $0^{th}$ order equations are the zeroth-order approximations of the nsub for the TE and TM polarizations. They are substituted into the second order equations of the nsub for TE and TM polarizations to determine fsub. In these equations and in the example provided herein, λ is the working wavelength of the optical signal, nsi is the refractive index of the surface material (silicon with a value of 3.476 in this example), and ntrench is the refractive index of the trench fill material (air with a value of 1 in the present example). $n^{(2)}TE$ and $n^{(2)}TM$ are the second order approximations of the nsub for the TE and TM polarizations, which is 2.45 in the present example.

Figure 4A:
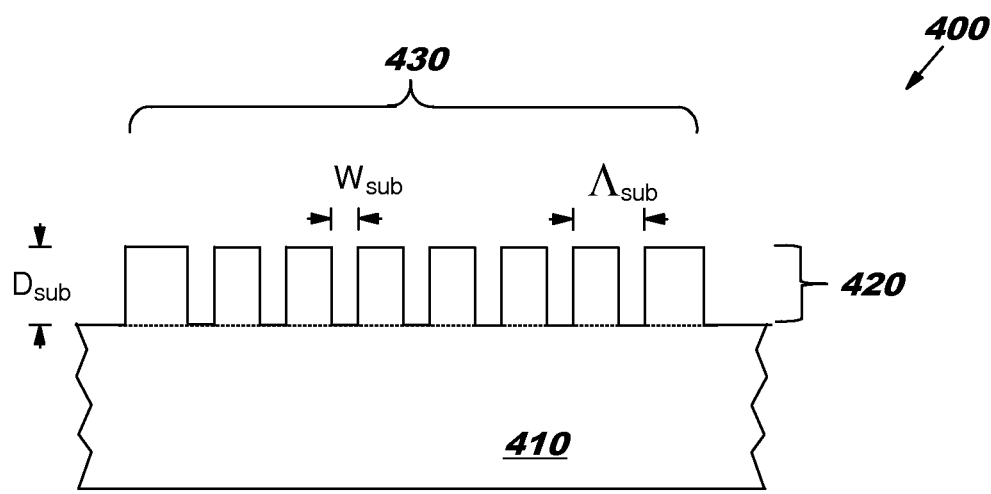
FIGS. 4A and 4B are widthwise and lengthwise cutaway views of the optical coupling device in which various embodiments may be implemented.

FIG. 4A is a widthwise cutaway view of the optical coupling device 400 in which various embodiments may be implemented. Although seven columns of apertures are shown for illustrative purposes, many more such apertures may be utilized in an actual implementation. Optical coupling device 400 includes a substrate 410 below an optical coupler 420. Optical coupler 420 may be a constructed of silicon or similar material. Substrate 410 may continue in the plane of the device and may contain many such devices. Substrate 410 may be an insulator such as silicon dioxide to provide electrical isolation from other devices. Grating 430 is shown with multiple apertures having width Wsub, subwavelength period Λsub, and depth Dsub. Dsub may be the depth of the surface layer used to build the apertures as shown in FIGS. 6A-6E below.

Figure 4B:
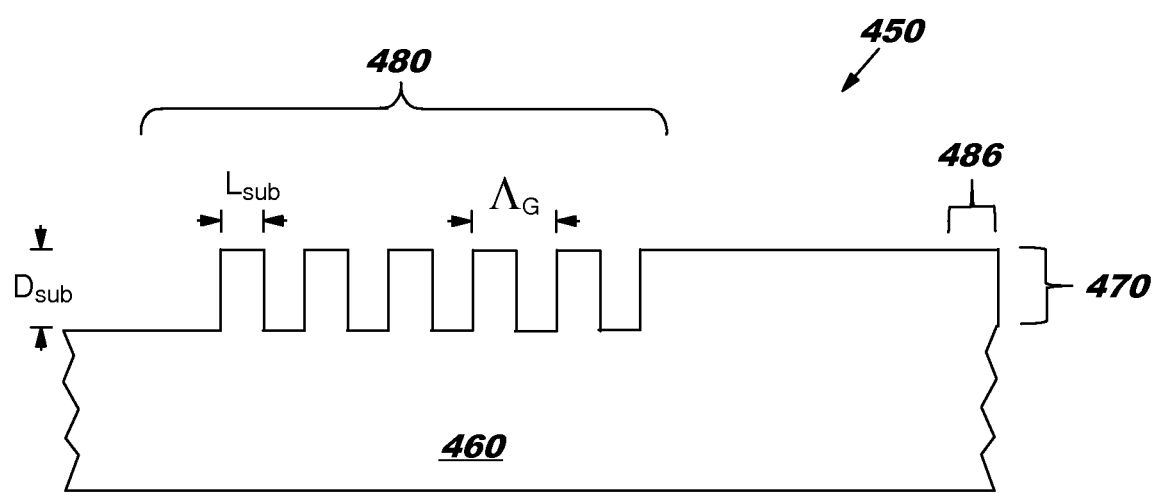

FIG. 4B is a lengthwise cutaway view of the optical coupling device 450 in which various embodiments may be implemented. Although five rows of apertures are shown for illustrative purposes, many more such apertures may be utilized in an actual implementation. Optical coupling device 450 includes a substrate 460 below an optical coupler 470. Optical coupler 470 may be a constructed of silicon or similar material. Substrate 460 may continue in the plane of the device and may contain many such devices. Substrate 460 may be an insulator such as silicon dioxide to provide electrical isolation from other devices. Grating 480 is shown with multiple apertures having length Lsub, grating period ΛG and depth Dsub. Waveguide 486 is also shown in this view.

Figure 5B:
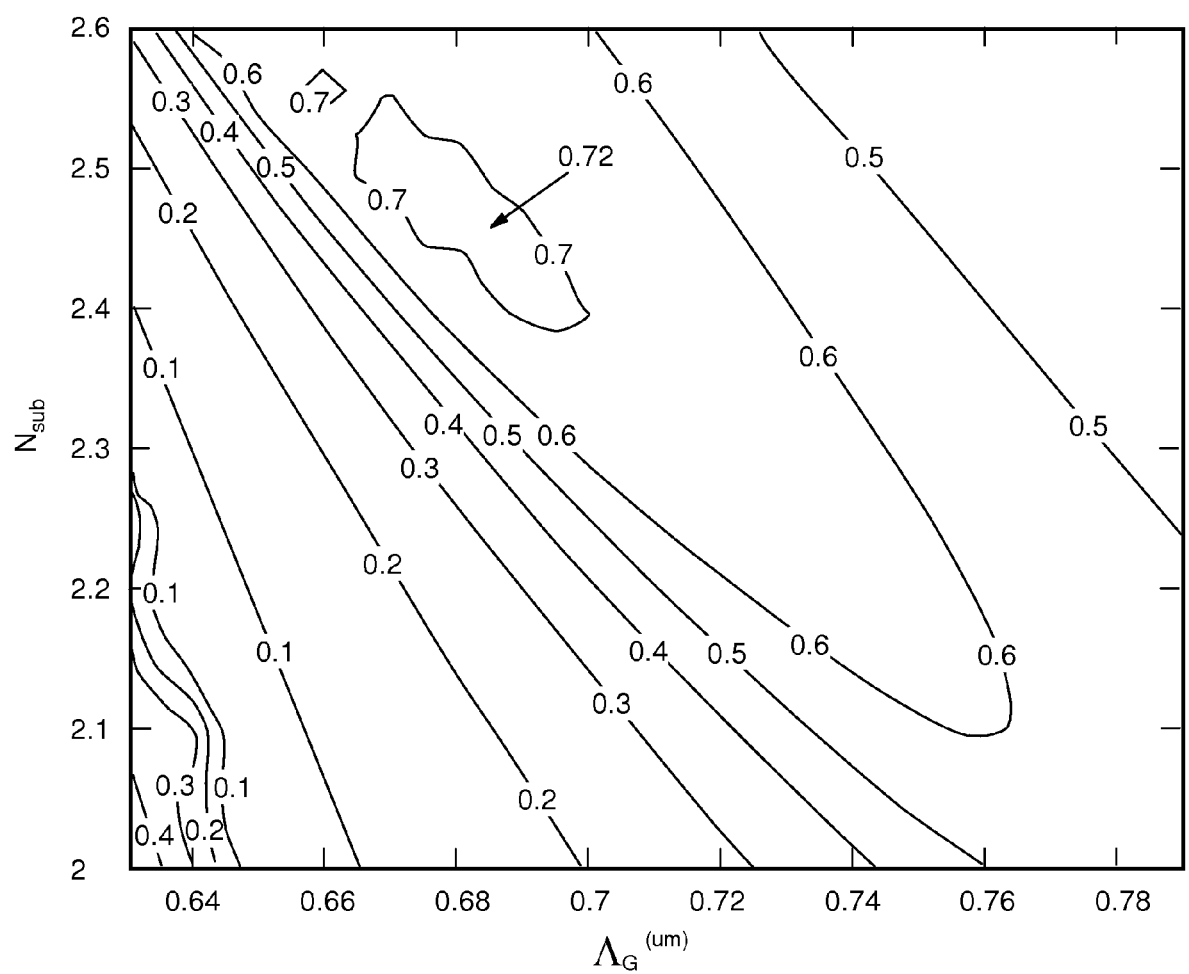
FIG. 5B is a diagram of a relationship between subwavelength structure refractive index, grating period and efficiency for a given optical signal wavelength.

FIG. 5A is a flow diagram of a process for configuring an optical coupling device in which various embodiments may be implemented. FIG. 5B is a diagram of a relationship between surface refractive index, grating period and efficiency for a given optical signal wavelength as described with step 520 below.

In a first step 500, the characteristics of the optical signal to the optical waveguide and the ambient conditions should be obtained, provided or otherwise determined. This includes the primary optical signal wavelength λ signal in nanometers (nm), polarization of that primary optical signal, and the characteristics of the surrounding medium which may exist between the optical cable and the grating. In the case of spread spectrum or other multiple wavelength optical signals, an average or median wavelength may be utilized. In the present example, a wavelength of 1550 nm is used for illustrative purposes. Also in the present example, the surrounding medium is air with an effective refractive index nair of 1. Other ambient conditions may be utilized such as a liquid medium.

In a second step 510, an optimal grating period ΛG and an optimal refractive index nsub for each row area of apertures may be determined with a known efficiency for the primary optical wavelength and ambient conditions. This determination may be accomplished using a variety of tools including a 2D simulation package CAMFR which is based on the eigenmode expansion technique. This is generated using the primary optical signal wavelength, polarization of that primary optical signal, and the refractive index of the surrounding medium. An example is shown in FIG. 5B where a gradient based set of efficiencies is shown for an optical wavelength of 1550 nm with a range of grating periods and aperture row area refractive indices. As shown, the optimum subwavelength area refractive index nsub is 2.45 and the optimum grating period ΛG is 0.685 μm with a maximum coupling efficiency of 0.72. Other parameters may be similarly calculated such as the optical fiber should be positioned with an emitting angle θ equal to 9.4 degrees in an air based medium.

In a third step 520, it is determined whether to optimize for transverse electric polarization (TE) or transverse magnetic polarization (TM) or a balance between those two optimizations. Some applications may perform better if TE is optimized, other applications may perform better if TM is optimized, yet other applications may need a balanced approach. This preference can then be utilized to determine the ideal aperture width Wsub and subwavelength period Λsub. In this example, the grating period ΛG is assumed to be double the length of each aperture length Lsub, resulting in a 50% duty cycle.

If TE is to be optimized, then in step 532 the second order approximation equation of the refractive indices of TE described above is utilized to determine the optimum filling factor fsub. If TM is to be optimized, then in step 534 the second order approximation equation of the refractive indices of TM described above is utilized to determine the optimum filling factor fsub. If a balance between TE and TM is to be optimized, then in step 536 the second order approximation equations of the refractive indices of TE and TM described above are both utilized to determine the optimum filling factor fsub for TE and for TM, with the results averaged or otherwise balanced in step 538. The results of steps 532, 534 or 536-538 are then utilized in step 540 to complete the design of the optimal optical coupling device given the ambient conditions, input signal characteristics, and the coupling device characteristics. The filling factor may be utilized to directly calculate the optimum aperture width and subwavelength period. The optical coupling device can then be manufactured in step 550 such as described below with reference to FIGS. 6A-6E.

FIG. 5B is a diagram of identifying the optimum subwavelength area refractive index nsub and the optimum grating period ΛG. This graph is generated using a 2D simulation package CAMFR which is based on the eigenmode expansion technique. This diagram is generated for a single wavelength, which is 1550 nm in this case. Given that wavelength, it is apparent that the optimum subwavelength area refractive index nsub is 2.45 and the optimum grating period ΛG is 0.685 μm with a maximum coupling efficiency of 0.72.

Figure 6A:
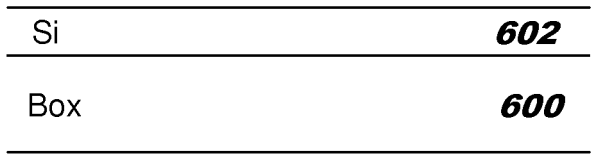
FIGS. 6A through 6E are widthwise cutaway views of the optical coupling device being manufactured in which various embodiments may be implemented.

FIG. 6A through 6E are widthwise cutaway views of the optical coupling device being manufactured in which various embodiments may be implemented. In FIG. 6A, an SOI (silicon on insulator) wafer is shown. The silicon (SI) layer 602 may be 250 nanometers in thickness over a buried silicon oxide (BOX) layer 600. In this example, the depth of the silicon layer sets the subsequent trench depth Dsub. The BOX may be 1 micron thick over an underlying silicon wafer (not shown). Alternative materials and dimensions may be utilized.

Figure 6B:
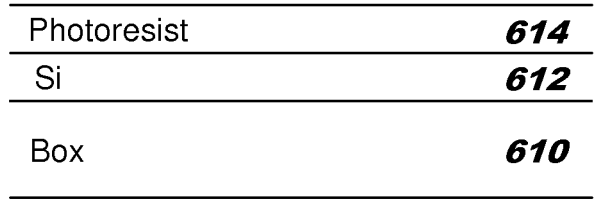
Figure 6C:
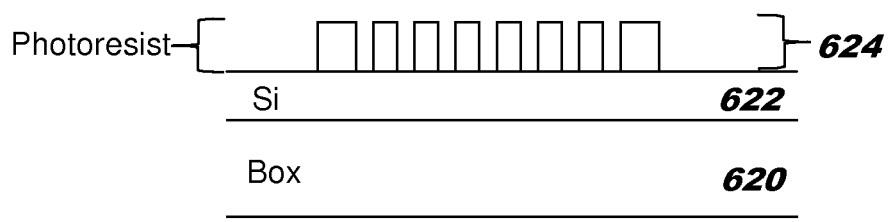

In a first step shown in FIG. 6B, a layer of photoresist 614 is applied over silicon 612 and buried oxide 610. The photoresist may be poured onto the SOI wafer while the wafer is spinning to obtain an even coat. The photoresist is then exposed with a pattern desired in the underlying silicon. This pattern is based on the dimensions determined utilizing the above described processes including the width and length of trenches and the grating and subwavelength periods. The unexposed photoresist is then removed (or the exposed photoresist is removed depending on the type of photoresist used), generating the photoresist structures 624 shown in FIG. 6C over silicon 622 and BOX 620.

Figure 6D:
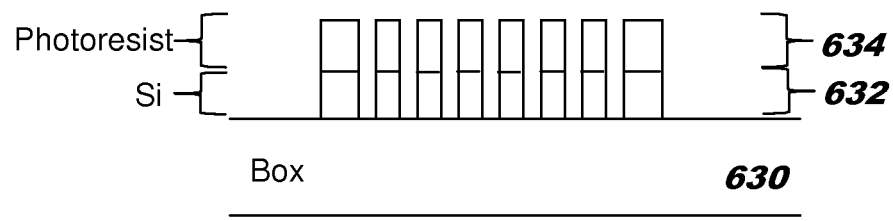
Figure 6E:
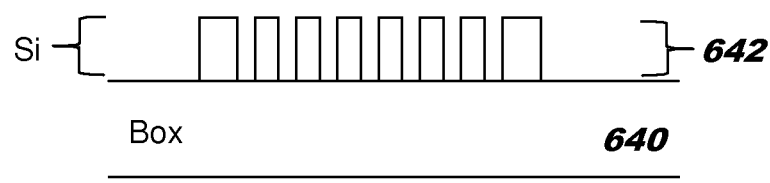

As shown in FIG. 6D, the exposed silicon 632 not covered by photoresist 634 is then etched using a process selective to silicon until the buried oxide 630 is reached. The etching may be timed and/or the buried oxide can act is an etch stop layer. As shown in FIG. 6E, the photoresist is then removed such as with a solvent selective for photoresist, resulting in the desired nanostructures in silicon 642 over buried oxide 640.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to explain the principles of the invention, the practical application, and to enable others of ordinary skill in the art to understand the invention for various embodiments with various modifications as are suited to the particular use contemplated.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of configuring an optical coupling device comprising:
   obtaining characteristics of an optical signal and ambient conditions for storage in a memory;
   utilizing a processor for identifying an optimum effective subwavelength area refractive index and a grating period for the input signal and ambient characteristics stored in memory; and utilizing the processor for identifying a preferred filling factor for a transverse polarization.

2. The method of claim 1 wherein the transverse polarization is selected from a group consisting of a transverse magnetic polarization, a transverse electric polarization, and a balance of the transverse magnetic polarization and the transverse electric polarization.

3. The method of claim 2 wherein the filling factor is utilized to calculate a subwavelength period for a given aperture width.

4. The method of claim 3 wherein the optical coupling device is manufactured utilizing the identified effective subwavelength area refractive index, the grating period, the aperture width and the subwavelength period.

5. The method of claim 4 wherein the filling factor is identified by utilizing a second order approximation equation of a refractive indices of the transverse polarization.

6. The method of claim 5 wherein the second order approximation equation is selected from a group consisting of $$n_{TE}^{(2)} = n_{TE}^{(0)}\left(1 + \frac{\pi^2}{3}\left(\frac{\Lambda_{sub}}{\lambda}\right)^2 f_{sub}^2(1-f_{sub})^2 (n_{trench}^2 - n_{si}^2)^2 (n_{TM}^{(0)})^2 \left(\frac{n_{TE}^{(0)}}{n_{trench}n_{si}}\right)^4\right)^{1/2}$$

and $$n_{TM}^{(2)} = n_{TM}^{(0)}\left(1 + \frac{\pi^2}{3}\left(\frac{\Lambda_{sub}}{\lambda}\right)^2 f_{sub}^2(1-f_{sub})^2 \left(\frac{n_{trench}^2 - n_{si}^2}{n_{TM}^{(0)}}\right)^2\right)^{1/2}.$$

7. The method of claim 4 wherein the optical coupling device is manufactured by patterning and etching the grating structures utilizing the identified effective subwavelength area refractive index, the grating period, the aperture width and the subwavelength period.

8. A data processing system for configuring an optical coupling device, the data processing system comprising:
 a processor; and
 a memory storing program instructions which when executed by the processor execute the steps of:
  obtaining characteristics of an optical signal and ambient conditions for storage in the memory;
  utilizing the processor for identifying an optimum effective subwavelength area refractive index and a grating period for the input signal and ambient characteristics stored in memory; and
  utilizing the processor for identifying a preferred filling factor for a transverse polarization.

9. The data processing system of claim 8 wherein the transverse polarization is selected from a group consisting of a transverse magnetic polarization, a transverse electric polarization, and a balance of the transverse magnetic polarization and the transverse electric polarization.

10. The data processing system of claim 9 wherein the filling factor is utilized to calculate a subwavelength period for a given aperture width.

11. The data processing system of claim 10 wherein the optical coupling device is designed for manufacturing by utilizing the identified effective subwavelength area refractive index, the grating period, the aperture width and the subwavelength period.

12. The data processing system of claim 10 wherein the filling factor is identified by utilizing a second order approximation equation of a refractive indices of the transverse polarization.

13. The data processing system of claim 12 wherein the second order approximation equation is selected from a group consisting of $$n_{TE}^{(2)} = n_{TE}^{(0)}\left(1 + \frac{\pi^2}{3}\left(\frac{\Lambda_{sub}}{\lambda}\right)^2 f_{sub}^2(1-f_{sub})^2 (n_{trench}^2 - n_{si}^2)^2 (n_{TM}^{(0)})^2 \left(\frac{n_{TE}^{(0)}}{n_{trench}n_{si}}\right)^4\right)^{1/2}$$

and $$n_{TM}^{(2)} = n_{TM}^{(0)}\left(1 + \frac{\pi^2}{3}\left(\frac{\Lambda_{sub}}{\lambda}\right)^2 f_{sub}^2(1-f_{sub})^2 \left(\frac{n_{trench}^2 - n_{si}^2}{n_{TM}^{(0)}}\right)^2\right)^{1/2}.$$

14. The data processing system of claim 11 wherein the optical coupling device is designed for patterning and etching the grating structures utilizing the identified effective subwavelength area refractive index, the grating period, the aperture width and the subwavelength period.

15. An optical coupling device comprising grating structures, wherein the grating structures are configured based on the steps of:
 obtaining characteristics of an optical signal and ambient conditions for storage in a memory;
 utilizing a processor for identifying an optimum effective subwavelength area refractive index and a grating period for the input signal and ambient characteristics stored in memory; and
 utilizing the processor for identifying a preferred filling factor for a transverse polarization.

16. The optical coupling device of claim 15 wherein the transverse polarization is selected from a group consisting of a transverse magnetic polarization, a transverse electric polarization, and a balance of the transverse magnetic polarization and the transverse electric polarization.

17. The optical coupling device of claim 16 wherein the filling factor is utilized to calculate a subwavelength period for a given aperture width.

18. The optical coupling device of claim 17 wherein the optical coupling device is manufactured utilizing the identified effective subwavelength area refractive index, the grating period, the aperture width and the subwavelength period.

19. The optical coupling device of claim 18 wherein the filling factor is identified utilizing a second order approximation equations of a refractive indices of the transverse polarization.

20. The optical coupling device of claim 19 wherein the second order approximation equation is selected from a group consisting of $$n_{TE}^{(2)} = n_{TE}^{(0)}\left(1 + \frac{\pi^2}{3}\left(\frac{\Lambda_{sub}}{\lambda}\right)^2 f_{sub}^2(1-f_{sub})^2 (n_{trench}^2 - n_{si}^2)^2 (n_{TM}^{(0)})^2 \left(\frac{n_{TE}^{(0)}}{n_{trench}n_{si}}\right)^4\right)^{1/2}$$

and $$n_{TM}^{(2)} = n_{TM}^{(0)}\left(1 + \frac{\pi^2}{3}\left(\frac{\Lambda_{sub}}{\lambda}\right)^2 f_{sub}^2(1-f_{sub})^2 \left(\frac{n_{trench}^2 - n_{si}^2}{n_{TM}^{(0)}}\right)^2\right)^{1/2}.$$

* * * * *